United States Patent [19]

Fukamichi et al.

[11] Patent Number: 5,837,068
[45] Date of Patent: Nov. 17, 1998

[54] MAGNETORESISTANCE EFFECT MATERIAL, PROCESS FOR PRODUCING THE SAME, AND MAGNETORESISTIVE ELEMENT

[75] Inventors: Kazuaki Fukamichi; Noriyuki Kataoka; Yutaka Shimada; Hideki Takeda, all of Sendai, Japan

[73] Assignee: Kazuaki Fukamichi and YKK Corporation, Miyagi, Japan

[21] Appl. No.: 778,920

[22] Filed: Jan. 6, 1997

Related U.S. Application Data

[62] Division of Ser. No. 580,476, Dec. 29, 1995, abandoned, which is a continuation of Ser. No. 282,745, Jul. 29, 1994, abandoned.

[30] Foreign Application Priority Data

Aug. 3, 1993  [JP]  Japan .................................. 5-192372

[51] Int. Cl.⁶ ........................................................ H01F 1/00
[52] U.S. Cl. ............................ 148/121; 148/678; 148/686
[58] Field of Search ..................... 148/121, 678, 148/686, 306, 310, 311, 312, 313, 315; 420/512, 485, 497, 82

[56] References Cited

U.S. PATENT DOCUMENTS

| | | | |
|---|---|---|---|
| 1,928,747 | 10/1933 | Wise | 148/686 |
| 2,145,792 | 1/1939 | Hensel et al. | 148/686 |
| 2,164,938 | 7/1939 | Peterson | 420/512 |
| 2,170,047 | 8/1939 | Dannöhl et al. | 420/485 |
| 2,196,824 | 4/1940 | Daha et al. | 148/315 |
| 2,347,543 | 4/1944 | Dannöhl | 148/313 |
| 2,489,529 | 11/1949 | Grange | 148/686 |
| 2,576,739 | 11/1951 | Williams | 420/512 |
| 2,696,544 | 12/1954 | Poch | 420/485 |
| 2,783,143 | 2/1957 | Johnson et al. | 148/686 |
| 3,658,997 | 4/1972 | Sloboda et al. | 420/512 |
| 4,191,601 | 3/1980 | Edens et al. | 148/686 |
| 4,678,636 | 7/1987 | Mizuhara | 420/497 |
| 5,028,391 | 7/1991 | Ingerson | 148/686 |
| 5,136,739 | 8/1992 | Takayanagi et al. | 420/512 |
| 5,164,026 | 11/1992 | Muller | 420/512 |
| 5,188,799 | 2/1993 | Mori et al. | 420/487 |
| 5,215,711 | 6/1993 | Mikawa | 420/487 |
| 5,259,898 | 11/1993 | Tauber et al. | 148/434 |

FOREIGN PATENT DOCUMENTS

| | | | |
|---|---|---|---|
| 3-294459 | 12/1991 | Japan | 148/686 |
| 4-280483 | 6/1992 | Japan . | |
| 3-294458 | 12/1992 | Japan | 148/686 |

OTHER PUBLICATIONS

Metals Handbook 8th ed. vol. 8, 1973, pp. 266,267,287,293 and 294.

"Giant Magnetoresistance in Single Layer and Multilayer Phase Separating Alloy Films,"S. Hossain, et al., Mat. Res. Soc. Symp. Proc. vol. 313, pp. 419–424, Apr. 1993.

"IEEE Translation Journal on Magnetics in Japan,"Miyazaki et al., vol. 6 ISSN 0882–4959, Nov. 1991.

*Primary Examiner*—John Sheehan
*Attorney, Agent, or Firm*—Finnegan, Henderson, Farabow, Garrett & Dunner, L.L.P.

[57] ABSTRACT

A bulk magnetoresistance effect material of a composition represented by the general formula: $T_{100-A}M_A$ (wherein T is at least one element selected between Cu and Au; M is at least one element selected from the group consisting of Co, Fe, and Ni; and A is in the range: $1 \leq A \leq 50$ by atomic percent) is prepared by casting a molten mixture of the above composition, and subjecting the resulting casting to homogenization and further to heat treatment. The bulk magnetoresistance effect material is high in the rate of change in the electrical resistance thereof, i.e., shows a large magnetoresistive effect and can be obtained in such bulk form in arbitrary shapes adaptable for various uses. Using the material, various types of magnetoresistive elements are obtained.

2 Claims, No Drawings

MAGNETORESISTANCE EFFECT MATERIAL, PROCESS FOR PRODUCING THE SAME, AND MAGNETORESISTIVE ELEMENT

This application is a division of application Ser. No. 08/580,476, filed Dec. 29, 1995, now abandoned, which is a continuation of application Ser. No. 08/282,745, filed Jul. 29, 1994, now abandoned.

BACKGROUND OF THE INVENTION

1. Field of the Invention

The present invention relates to a bulk magnetoresistance effect material obtained by casting, which can be worked into an arbitrary shape such as a sensor requiring a complicated shape, a sensor for use in a site wherein a heat resistance is required thereof, a sensor additionally having the function of a structural material, or a sensor having a high corrosion resistance, and to a process for producing the same and a magnetoresistive element made using the above bulk magnetoresistance effect material.

2. Description of the Prior Art

Magnetoresitive elements are widely utilized as magnetic field sensors and magnetic heads since they are high in sensitivity and capable of securing a comparatively large output. In such magnetic field sensors and such magnetic heads, a direct-current magnetic field is applied thereto as a bias for the purpose of enhancing the sensitivity thereof and bringing the response thereof close to a linear one. Thin Permalloy films, which show a magnetoresistivity of about 2% and are as small as about 5 Oe in anisotropic magnetic field as the yardstick of easiness of magnetization thereof and hence easy of application thereto of a bias, have heretofore been widely used as the magnetoresistive elements.

Further, multi-layered film magnetoresistance effect materials comprising alternatingly laminated thin magnetic films differing in coercive force (e.g., see Japanese patent Laid-Open No. 280,483/1992) are known as means for magnifying the change in the electrical resistance thereof. This kind of multi-layered film giant magnetoresistance effect material (GMR) involves a problem that conduction electrons are scattered depending on the direction of the magnetization of the magnetic layers thereof, while scattering of conduction electrons varies depending on the correlation of magnetization between magnetic particles themselves dispersed in the matrix of the granular GMR. Further, high-precision control of the thickness periodicity of films to be laminated one on another is needed to involve problems such as a difficulty in production of such a material, a necessity of expensive equipment, and a difficulty in the working of the resulting material due to the laminate film structure thereof, leading to an incapability of fabricating it into various shapes adapted for uses thereof. Moreover, this kind of multi-layered film GMR, which is obtained by the sputtering method, the liquid quenching method or the like, involves a further problem that it is restricted in the form thereof, particularly in the thickness thereof so that only a thickness of at most about 0.1 mm is attainable.

SUMMARY OF THE INVENTION

Accordingly, an object of the present invention is to provide a magnetoresistance effect material which is high in the rate of change in the electrical resistance thereof, i.e., shows a large magnetoresistive effect and can be obtained in such bulk form by casting as to be workable into various shapes adapted for uses thereof.

Another object of the present invention is to provide a process for producing such a bulk magnetoresistance effect material and a further object is to provide a magnetoresistive element made therefrom.

The present invention provides a bulk magnetoresistance effect material consisting of a composition represented by the general formula: $T_{100-A}M_A$, wherein T is at least one element selected from the group consisting of Cu and Au; M is at least one element selected from the group consisting of Co, Fe, and Ni; and A is in the range: $1 \leq A \leq 50$ by atomic percent.

Especially, the bulk magnetoresistance effect material preferably consists of a composition represented by the general formula: $Cu_{100-X-Y-Z}Co_XFe_YNi_Z$, wherein X, Y, and Z are each an atomic percentage, provided that $1 \leq X$, Y, $Z \leq 50$, $1 \leq X+Y+Z \leq 50$, $Y/(Y+Z)>0.05$, and $X/(X+Z)>0.2$.

Also, in the above general formula $T_{100-A}M_A$, M and/or T may be partially substituted up to 25 atomic percent for each of T and M with at least one transition element other than Co, Fe, Ni and Cu.

In accordance with another aspect of the present invention, there is provided a process for producing the foregoing bulk magnetoresistance effect material, comprising:

casting a molten mixture consisting of the above-defined composition; and subjecting the resulting casting to homogenization, followed by heat treatment.

The temperature $T_1$ of the homogenization is preferably in the range: $(Tm-200) K<T_1<(Tm-5) K$ (wherein Tm: melting point of the composition) and the time $t_1$ thereof is in the range: $0.5 \text{ hour}<t_1<24$ hours, while the temperature $T_2$ of said heat treatment is in the range: $673K \leq T_2 \leq 973K$ and the time $t_2$ thereof is in the range: $5 \text{ minutes} \leq t_2 \leq 24$ hours. According to the process, there can be obtained bulk magnetoresistance effect materials in various shapes with a thickness of 0.1 to 500 mm.

The present invention further provides a magnetoresistive element made using as the above-mentioned magnetoresistance effect material.

DETAILED DESCRIPTION OF THE PREFERRED EMBODIMENTS

The bulk magnetoresistance effect materials of the present invention represented by the above general formula consists of at least one ferromagnetic element selected between Cu and Au and at least one paramagnetic or diamagnetic element selected from the group consisting of Co, Fe and Ni, and can be formed into a magnetoresistance effect material capable of bringing about a large change in the electrical resistance thereof by making the alloy heterogeneous magnetically and compositionally. Further, the precipitation of fine ferromagnetic particles in the above alloy is also effective in bringing about a large change in the electrical resistance of the material.

Here, the term "precipitation of fine ferromagnetic particles" refers to crystallization, precipitation or segregation of ferromagnetic particles through casting of a molten mixture consisting of the composition represented by the general formula: $T_{100-A}M_A$, wherein T is at least one element selected from the group consisting of Cu and Au; M is at least one element selected from the group consisting of Co, Fe, and Ni; and A is in the range: $1 \leq A \leq 50$ by atomic percent, homogenization of the resulting casting and subsequent heat treatment thereof.

Here, the size of the ferromagnetic particles precipitated is preferably 1 to 1,000 nm from the viewpoint of the magnetoresistance effect thereof. When it is smaller than 1 nm or exceeds 1,000 nm, any high magnetoresistance effect, which is one of the purposes of the present invention, can be secured. An especially preferable size of the ferromagnetic particles is 1 to 300 nm from the viewpoint of the magnetoresistance effect thereof.

When the value of A in the above general formula is lower than 1, the amount of the fine ferromagnetic particles, which bring about a change in the resistance of the material, is so small that no large change in the electrical resistance of the resulting material is effected by a change in magnetic field. On the other hand, when it exceeds 50, the amount of the fine ferromagnetic particles is so large that the resistance of the resulting material is increased to lower the contribution of scattering of conduction electrons in a paramagnetic substance. Thus, it is specified in the range: $1 \leq A \leq 50$. The value of A is preferably in the range of 5 to 50, further preferably in the range of 15 to 30.

The alloy composition represented by the general formula is preferably a composition represented by the general formula: $Cu_{100-X-Y-Z}Co_XFe_YNi_Z$ (wherein X, Y, and Z are each an atomic percentage, provided that $1 \leq X, Y, Z \leq 50$, $1 \leq X+Y+Z \leq 50$, $Y/(Y+Z)>0.05$, and $X/(X+Z)>0.02$) from the viewpoint of securing finer ferromagnetic particles to be precipitated and a higher magnetoresistance effect. The reason for $1 \leq X, Y, Z \leq 50$ and $1 \leq X+Y+Z \leq 50$ is that, when the proportion of Cu mainly in charge of electrical conduction is 50 atomic percent or less, the resistance of the resulting material is increased to thereby lower the magnetoresistance effect thereof. The reason for $Y/(Y+Z)>0.05$ is that no magnetoresistance effect can be expected when the ratio of the Fe content to the total content of Fe and Ni is too low, though the addition of Fe in a small amount may produce a magnetoresistance effect. Here, important is that, when this ratio is low, the resulting alloy is substantially a Cu—Ni alloy to fail to manifest a magnetoresistance effect. Thus, at least a given amount of Fe is necessary in a Cu—Ni alloy in order to secure a magnetoresistance effect. The reason for $X/(X+Z)>0.2$ is that, although Ni serves to improve the texture, etc., of the material in the case of a combination of Co and Ni to increase the magnetoresistance ratio (MR ratio; $\Delta R/R$) thereof, too much Ni decreases the MR ratio (unrestricted in the case of a combination thereof with Fe), while the ratio of the Co content to the total content of Co and Ni must be specified as in the above case and the proportion of Co must be high as compared with the above cases of Fe.

The partial substitution of at most 25 atomic percent of M and/or at most 25 atomic percent of T with at least one transition metal provides a higher magnetoresistance effect. Examples of such transition metal elements include Ag, Pd, and Pt and among them, Ag is especially preferable. Particularly, these elements are effective because they are capable of precipitating finer ferromagnetic particles.

The bulk magnetoresistance effect material of the present invention is produced by casting a molten mixture consisting of the above-defined composition represented by the general formula: $T_{100-A}M_A$, in which T and/or M may be each partially replaced in an amount of 25 atomic percent or less with at least one transition element other than Cu, Au, Co, Fe and Ni and Cu, preferably $Cu_{100-X-Y-Z}Co_XFe_YNi_Z$; and subjecting the resulting casting to homogenization, followed by heat treatment.

In the process of the present invention, molds conformable to various kinds of shapes may be used in the casting step to secure shapes adapted for uses, while alternatively a basic form may be prepared in the casting step and then worked into shapes adapted for uses by customary plastic working (rolling, forging, etc.). The resulting materials of various shapes are subjected to homogenization and then to heat treatment to impart thereto a high magnetoresistance effect, whereby magnetoresistance effect materials of various shapes can be provided. The materials thus obtained are not particularly restricted in dimensions, and may range from 0.1 to 500 mm in thickness. It goes without saying that these materials may further be made thinner by rolling or the like.

The temperature $T_1$ of the homogenization is preferably in the range: $(Tm-200) K<T_1<(Tm-5) K$ (wherein Tm: melting point), while the time $t_1$ thereof is preferably in the range: $0.5 hour<t_1<24 hours$. A difference between the homogenization temperature and the melting point of 5K or less is unfavorable for the homogenization treatment because of the liability of fusion with a support. On the other hand, a difference of 200K or larger is unsuitable because the homogenization may take a very long time or become impossible. When the time is 0.5 hour or shorter, the temperature elevation and the homogenization may be insufficient. When it is 24 hours or longer, the homogenization may become uneconomical.

The temperature $T_2$ of the heat treatment is preferably in the range: $673K \leq T_2 \leq 973K$, while the time $t_2$ thereof is preferably in the range: $5 minutes \leq t_2 \leq 24 hours$. Determinant factors for the conditions of the heat treatment for providing a higher MR ratio ($\Delta R/R$) are the temperature and time thereof. A temperature of lower than 673K requires an uneconomical time exceeding 24 hours, while a temperature exceeding 973K entails a short-time ($t<5$ minutes) heat treatment, and hence is unsuitable because of problems with controllability and homogeneity. In the case of a composition comprising about 50 to 70 atomic percent of Cu, however, the foregoing does not apply thereto since the magnetoresistance effect has already been secured in the homogenization step.

The magnetoresistive elements of the present invention are made using the aforestated magnetoresistance effect material by means usually employed in general magnetoresistive elements, examples of which means include embedment thereof in any one of various substrates, application thereto of a bias magnetic field, coverage of the surface of the magnetoresistive element with any one of various protective films, use of a fixed magnet which can be justified by rotation according to the desired magnetoresistive effect, in combination therewith, provision of a zigzag magnetosensitive pattern thereto and combination of such magnetosensitive pattern in various directions.

The following Examples will further illustrate the present invention in more detail.

EXAMPLE

Each mother alloy of a composition (by atomic ratio) as shown in Table 1 was melted in an arc melting furnace or a high-frequency melting furnace, subjected to homogenization in vacuo at 1,000° C. for 2 hours, and quenched in iced water to effect complete or partial solid solution thereof, the confirmation of which was made by measuring a change in the lattice constant thereof with an X-ray diffractometer and magnetization thereof with a VSM (vibrating sample magnetometer). For example, in the case of Sample No. 1 in Table 1, about 50 g of Cu—Co prepared by arc melting was subjected to homogenization and quenched in the same manner as described above to effect complete or partial solid solution of Co in Cu. The resulting solid solution alloy was worked (cut out, rolled, forged, etc.), and subjected to heat treatment at 500° C. for 1 to 3 hours (at 400° C. for 1 to 3 hours in the case of Au) to prepare a bulk wherein magnetic particles were precipitated and dispersed. The bulk sample thus obtained was cut into 0.1 mm×0.5 mm×10 mm pieces to prepare samples, which were then cut into a predetermined shape, followed by structural analysis thereof according to customary X-ray diffractometry (with a diffractometer), measurement of the magnetic properties thereof by the VSM (vibrating sample magnetometer), and measurement of the resistance thereof according to the DC four-point probe method with application thereto of a magnetic field of 10 kOe. The results are shown in Table 1.

TABLE 1

| Sample No. | Alloy composition | ΔR/R (%) | Size of precipitated magnetic particle (nm) |
|---|---|---|---|
| 1 | $Cu_{90}Co_{10}$ | 8 | 1–20 |
| 2 | $Cu_{97.3}Co_{2.7}$ | 2 | 1–5 |
| 3 | $Cu_{90}Fe_{10}$ | 7 | 1–20 |
| 4 | $Cu_{80}Co_{15}Ni_5$ | 5 | 1–20 |
| 5 | $Cu_{80}Co_5Ni_{15}$ | 0.5 | 1–5 |
| 6 | $Cu_{64}Ni_{27}Fe_9$ | 5 | 1–50 |
| 7 | $Cu_{80}Ni_{15}Fe_5$ | 6 | 1–20 |
| 8 | $Cu_{70}Co_{10}Ni_{10}Fe_{10}$ | 6 | 1–30 |
| 9 | $Au_{80}Co_{20}$ | 4 | 1–20 |
| 10 | $Au_{70}Co_{30}$ | 7 | 1–100 |
| 11 | $Au_{85}Co_{15}$ | 10 | 1–50 |
| 12 | $Au_{90}Co_{10}$ | 7 | 1–20 |
| 13 | $Au_{80}Fe_{20}$ | 2 | 1–50 |
| 14 | $Au_{70}Fe_{30}$ | 5 | 1–100 |
| 15 | $Au_{80}Co_{15}Fe_5$ | 13 | 1–50 |
| 16 | $Au_{80}Co_{10}Fe_{10}$ | 6 | 1–50 |
| 17 | $Au_{80}Co_{15}Ni_5$ | 9 | 1–50 |
| 18 | $Au_{70}Co_{20}Ni_{10}$ | 8 | 1–100 |
| 19 | $Au_{70}Fe_{20}Ni_{10}$ | 6 | 1–100 |
| 20 | $Au_{60}Fe_{30}Ni_{10}$ | 5 | 1–100 |

The resulting magnetoresistance effect was isotropic. Thus, materials having an MR ratio substantially equal to or higher than about 4% as the MR ratio of a practical anisotropic magnetoresistance effect alloy Permalloy (NiFe alloy) can be appreciated as those for isotropic magnetic field sensors.

According to the present invention, a magnetoresistance effect material high in the rate of change in the electrical resistance thereof and adaptable in shape for various uses can be obtained in bulk form. Further, according to the present invention, a desired bulk magnetoresistance effect material can be easily produced by casting without the necessity for complicated control, and worked into arbitrary shapes adapted for uses to widen the fields of application thereof.

What is claimed is:

1. A process for producing a bulk magnetoresistance effect material, comprising the steps of:

casting a molten composition represented by the general formula $T_{100-A}M_A$, where T is at least one ferromagnetic element selected from the group consisting of Cu and Au, up to 25 atomic percent of T being substituted with at least one transition element other than Cu, Au, Co, Fe, or Ni, and M is at least one paramagnetic or diamagnetic element selected from the group consisting of Co, Fe, and Ni, up to 25 atomic percent of M being partially substituted with at least one transition element other than Cu, Au, Co, Fe, and Ni; wherein A is in the range, $1 \leq A \leq 50$ atomic percent; and subjecting the resulting casting to homogenization, followed by heat treatment the homogenization being conducted at a temperature $T_1$ which is in the range: $(Tm-200)°K < T_1 < (Tm-5)°K$, Tm being the melting point of the material, and for a time $t_1$ which is in the range: 0.5 hour $< t_1 <$ 24 hours, and the heat treatment being conducted at a temperature $T_2$ which is in the range: $673°K \leq T_2 \leq 973°K$ for a time $t_2$ which is in the range: 5 minutes $\leq t_2$ 24 hours;

the resulting magnetoresistance effect material having a thickness of 0.1 to 500 mm and containing precipitated ferromagnetic particles having a size of from about 1 to about 1000 nm.

2. A process for producing a bulk magnetoresistance effect material as claimed in claim 1, wherein said general formula is represented by $Cu_{100-X-Y-Z}Co_XFE_YNi_Z$, wherein X, Y, and Z are each an atomic percentage, provided that $1 \leq X \leq 50$, $1 \leq Y \leq 50$, $1X \leq 50$, $1 \leq X+Y+Z \leq 50$, $Y/(Y+Z) > 0.05$, and $X/X+Z) > 0.2$.

* * * * *

UNITED STATES PATENT AND TRADEMARK OFFICE
CERTIFICATE OF CORRECTION

PATENT NO.: 5,837,068

DATED: November 17, 1998

INVENTORS: Kazuaki FUKAMICHI et al.

It is certified that an error appears in the above-identified patent and that said Letters Patent is hereby corrected as shown below:

On the Title Page, Item [73], in the Assignee, line 1, after "Fukamichi", insert --Miyagi, Japan;--; and
      line 2, "Miyagi" should read --Tokyo--.

In Claim 1, col. 6, line 32, after "$t_2$", insert --$\leq$--.
In Claim 2, col. 6, line 42, "$1X\leq50$" should read --$1\leq X\leq 50$--.
In Claim 2, col. 6, line 43, "X/X+Z)" should read --X/(X+Z)--.

Signed and Sealed this

Twenty-first Day of September, 1999

*Attest:*

Q. TODD DICKINSON

*Attesting Officer*     *Acting Commissioner of Patents and Trademarks*